United States Patent
Donath (10) Patent No.: US 9,712,147 B2
(45) Date of Patent: Jul. 18, 2017

(54) METHOD FOR DRIVING A TRANSISTOR DEVICE AND ELECTRONIC CIRCUIT

(71) Applicant: Infineon Technologies AG, Neubiberg (DE)

(72) Inventor: Stephan Donath, Unterhaching (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 15/242,342

(22) Filed: Aug. 19, 2016

(65) Prior Publication Data
US 2017/0054437 A1 Feb. 23, 2017

(30) Foreign Application Priority Data
Aug. 20, 2015 (DE) ........................ 10 2015 113 796

(51) Int. Cl.
*H03K 17/041* (2006.01)
(52) U.S. Cl.
CPC ............... *H03K 17/04106* (2013.01)

(58) Field of Classification Search
USPC ................................. 327/108–109, 291, 299
See application file for complete search history.

(56) References Cited

U.S. PATENT DOCUMENTS

| | | | |
|---|---|---|---|
| 5,206,549 A * | 4/1993 | Suzuki | G01R 23/10 327/40 |
| 5,315,449 A | 5/1994 | Dayton et al. | |
| 9,531,372 B1 * | 12/2016 | Mukherjee | H03K 19/0185 |

* cited by examiner

*Primary Examiner* — An Luu
(74) *Attorney, Agent, or Firm* — Slater Matsil, LLP (57) ABSTRACT

Disclosed is a method and a drive circuit. The method includes measuring a frequency of an input signal received by a drive circuit and driving a transistor device by the drive circuit based on the input signal such that a switching speed of the transistor is dependent on the measured frequency. The drive circuit is configured to receive an input signal, to measure a frequency of the input signal, and to drive a transistor device based on the input signal such that a switching speed of the transistor is dependent on the measured frequency.

20 Claims, 5 Drawing Sheets

METHOD FOR DRIVING A TRANSISTOR DEVICE AND ELECTRONIC CIRCUIT

CROSS-REFERENCE TO RELATED APPLICATIONS

This application claims priority to German Application No. 10 2015 113 796.8, filed on Aug. 20, 2015, which application is hereby incorporated herein by reference in its entirety.

TECHNICAL FIELD

This disclosure in general relates to a method for driving a transistor device and an electronic circuit including a drive circuit for driving a transistor device.

BACKGROUND

Transistor devices are widely used as electronic switches in a variety of different applications, such as industrial, automotive, or consumer applications. Those applications may include power conversion, motor drive, heating or lighting applications, to name only a few. In many of these applications, a driver switches on and off the transistor device based on a PWM (pulse-width modulated) signal. A frequency of this PWM signal can be dependent on the type of application and/or an operation state of the respective application. For example, in heating applications where a transistor device can be used to drive a heating resistor a frequency of the PWM signal can be several 10 Hz; in lighting applications where a transistor device can be used to drive a lamp, such as a light emitting diode (LED), a frequency of the PWM signal can be several 100 Hz; in automotive applications where a transistor device can be used to drive a magnetic valve a frequency of the PWM signal can be several kilohertz (kHz); in motor drive applications where a transistor device can be used to drive a brushed DC motor a frequency of the PWM signal can be several 10 kHz; and in power conversion applications where a transistor device can be used to drive an inductive load (choke) a frequency of the PWM signal can be several 10 kHz up to several 100 kHz.

Switching on and off a transistor device may be associated with electromagnetic interference (EMI) whereas a frequency of the EMI is the higher the faster the transistor device toggles between an on-state (switched on state) and an off-state (switched off state) In those applications where the transistor device is to be driven at high frequencies it may be necessary to switch on and off the transistor device fast so as to keep switching losses low. High switching speeds are associated with high frequency EMIs. Those high frequency EMIs are difficult to handle. There is therefore a need to provide a method for driving a transistor device that provides a tradeoff between switching losses and EMI.

SUMMARY

One example of this disclosure relates to a method. The method includes measuring a frequency of an input signal received by a drive circuit, and driving a transistor device by the drive circuit based on the input signal such that a switching speed of the transistor is dependent on the measured frequency.

Another example relates to a drive circuit. The drive circuit is configured to receive an input signal, to measure a frequency of the input signal, and to drive a transistor device based on the input signal such that a switching speed of the transistor is dependent on the measured frequency circuit.

BRIEF DESCRIPTION OF THE DRAWINGS

Examples are explained below with reference to the drawings. The drawings serve to illustrate certain principles, so that only aspects necessary for understanding these principles are illustrated. The drawings are not to scale. In the drawings the same reference characters denote like features.

DETAILED DESCRIPTION OF ILLUSTRATIVE EMBODIMENTS

In the following detailed description, reference is made to the accompanying drawings. The drawings form a part of the description and by way of illustration show specific examples in which the invention may be practiced. It is to be understood that the features of the various examples described herein may be combined with each other, unless specifically noted otherwise.

Figure 1:
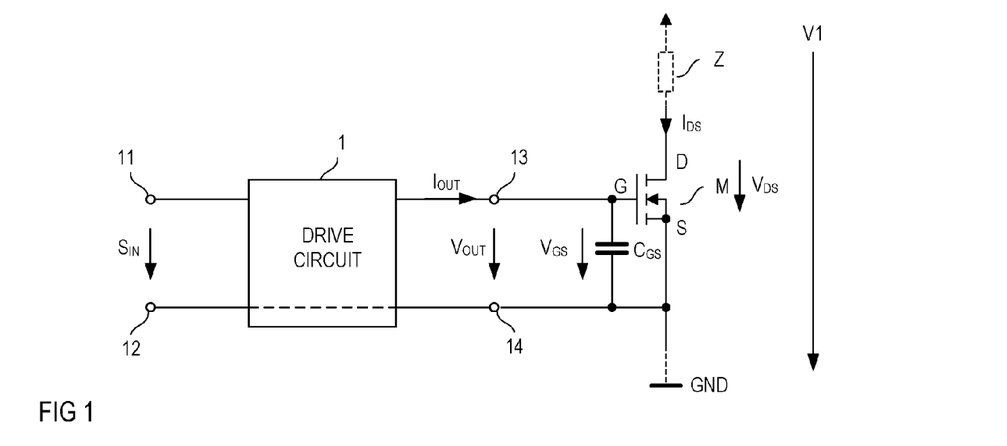
FIG. 1 schematically illustrates an electronic circuit including a transistor device and a drive circuit.

FIG. 1 shows an electronic circuit according to one example. The electronic circuit includes a drive circuit 1 with an input 11, 12 configured to receive an input signal $S_{IN}$, and an output 13, 14 configured to provide an output signal $V_{OUT}$, $I_{OUT}$. According to one example, the input includes a first input node 11, 12 and the input signal $S_{IN}$ is a voltage between the first input node 11 and the second input node 12. According to one example, the output 13, 14 includes a first output node 13 and a second output node 14, and the output signal is at least one of a voltage $V_{OUT}$ between the first output node 13 and the second output node 14, and an output current $I_{OUT}$. The drive circuit 1 may additionally include a supply node configured to receive a supply voltage, and the drive circuit 1 may be configured to generate the output signal $V_{OUT}$, $I_{OUT}$ based on the input signal $S_{IN}$ using the supply voltage. However, such supply node and supply voltage are not illustrated in FIG. 1.

The drive circuit 1 is configured to drive a transistor device M coupled to the output 13, 14. In the example shown in FIG. 1, the transistor device M is implemented as a MOSFET (Metal Oxide Semiconductor Field-Effect Transistor). A MOSFET is a voltage controlled transistor device; an operation state (on or off) of the MOSFET M is dependent on a voltage level of a voltage $V_{GS}$ between a gate node G and a source node S. This voltage $V_{GS}$, which will also be referred to as gate-source voltage in the following, is dependent on a charge state of an internal gate-source capacitance coupled between the gate node G and the source node S. In FIG. 1, for the purpose of illustration, such gate-source capacitance is drawn as a capacitor $C_{GS}$ between the gate node G and the source node S. The gate node G of the transistor device M is connected to the first output node 13 and the source node S is connected to the second output node 14 of the drive circuit 1. By this, the gate-source voltage $V_{GS}$ of the transistor device M corresponds to the output voltage $V_{OUT}$ of the drive circuit 1.

Just for the purpose of explanation it is assumed that the transistor device M driven by the drive circuit 1 is an n-type enhancement MOSFET, as shown in FIG. 1. Such n-type enhancement MOSFET switches on when a voltage level of the gate-source voltage $V_{GS}$ rises above a positive threshold level, which is often referred to as threshold voltage. Consequently, an n-type enhancement MOSFET switches off when a voltage level of the gate-source voltage $V_{GS}$ falls below the threshold voltage. However, the drive circuit and the method explained herein below are not restricted to be used in context with driving an n-type enhancement MOSFET. Instead, any other type of MOSFET, such as an n-type depletion MOSFET, a p-type enhancement MOSFET, a p-type depletion MOSFET, or an IGBT (Insulated Gate Bipolar Transistor) may be used as well. An n-type depletion MOSFET is different from an n-type enhancement MOSFET in that the threshold voltage is a negative voltage, while in an n-type enhancement MOSFET the threshold voltage is a positive voltage. A p-type enhancement MOSFET is different from an n-type enhancement MOSFET in that it switches on when the gate-source voltage falls below a negative threshold voltage. A p-type depletion MOSFET is different from an n-type enhancement MOSFET in that it switches on when the gate-source voltage falls below a positive threshold voltage. An IGBT can be driven like an n-type enhancement MOSFET.

Figure 2:
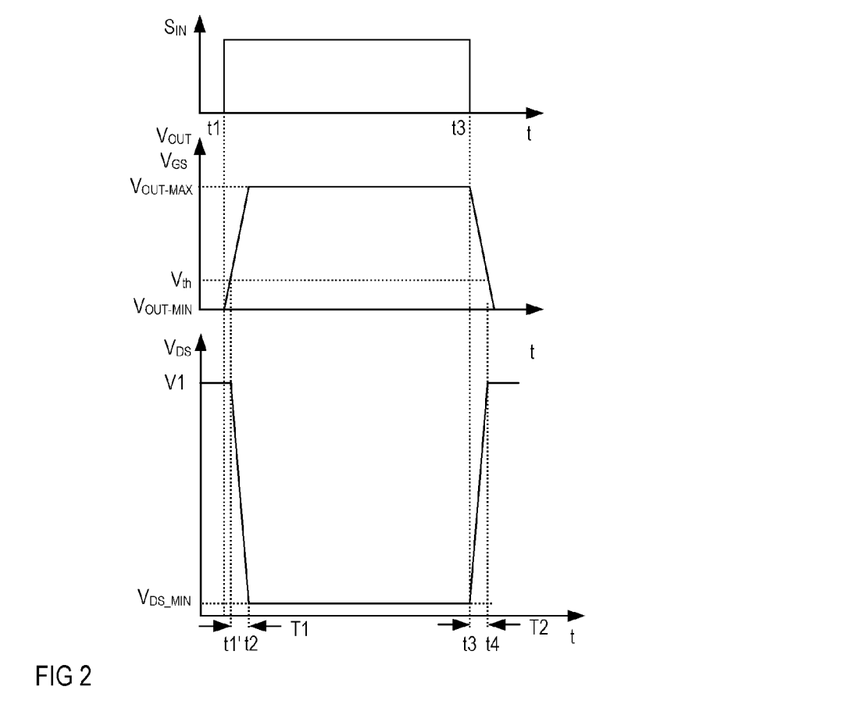
FIG. 2 shows waveforms that illustrates one way of operation of the drive circuit.

FIG. 2 schematically shows waveform diagrams that illustrate one example of how the drive circuit 1 drives the transistor device M. In particular, FIG. 2 shows waveform diagrams of one example of the input signal $S_{IN}$, the output voltage $V_{OUT}$, which is equal the gate-source voltage $V_{GS}$, and an output voltage $V_{DS}$ of the transistor device M. This output voltage $V_{DS}$ is a voltage between a drain node D and the source node S of the transistor device and will be referred to as drain-source voltage $V_{DS}$ in the following. Just for the purpose of explanation it is assumed that a load path of the transistor device M is connected in series with a load Z and the series circuit with the transistor device M and the load Z is connected between supply nodes where a first supply potential Vi and a second supply potential (or ground potential GND) is available. The load path of the transistor device M is an internal path between the drain node D and the source node S. The load path will also be referred to as drain-source path D-S in the following.

Referring to FIG. 2, the input signal $S_{IN}$ may have one of two different signal levels, namely an on-level and an off-level. The on-level of the input signal $S_{IN}$ indicates that it is desired to switch on the transistor device M, and the off-level indicates that it is desired to switch off the transistor device M. Just for the purpose of illustration, the on-level is a high signal level and the off-level is a low signal level in the waveform diagram shown in FIG. 2.

FIG. 2 shows a time period in which the input signal $S_{IN}$ changes from the off-level to the on-level at a time t1 and from the on-level to the off-level at a time t3. Referring to FIG. 2, the drive circuit 1 is configured to increase the signal level of the output voltage $V_{OUT}$ beginning at the time t1, and to decrease the voltage level of the output voltage $V_{OUT}$ beginning at the time t3. Delay times that may result from processing the input signal $S_{IN}$ in the drive circuit 1 are not considered (not shown) in the waveform diagrams shown in FIG. 2. Referring to FIG. 2, beginning at time t1 the output voltage $V_{OUT}$ rises from a minimum level $V_{OUT\text{-}MIN}$ to a maximum level $V_{OUT\text{-}MAX}$. Equivalently, beginning at time t3, the output voltage $V_{OUT}$ decreases from the maximum level $V_{OUT\text{-}MAX}$ to a minimum level $V_{OUT\text{-}MIN}$. Just for the purpose of illustration it is assumed that the output voltage $V_{OUT}$ increases and decreases linearly beginning at t1 and t3, respectively. As the increase and the decrease of the output voltage $V_{OUT}$ is associated with charging and discharging the gate-source capacitance $C_{GS}$, the increase and the decrease is not strictly linear in a real circuit. However, for the purpose of illustration, it can be assumed that the output voltage $V_{OUT}$ increases and decreases linearly.

Before time t1, the transistor device M is in the off-state, so that the drain-source voltage $V_{DS}$ substantially equals a voltage Vi between the first supply node and the second supply node. When the gate-source voltage $V_{GS}$, after time t1, reaches the threshold level (threshold voltage) $V_{th}$, the transistor device M starts to conduct so that the drain-source voltage $V_{DS}$ decreases. In FIG. 2, t1' denotes a time when the gate-source voltage $V_{GS}$ reaches the threshold voltage. After this time t1', as the gate-source voltage $V_{GS}$ increases, the drain-source voltage $V_{DS}$ decreases until it reaches a minimum level $V_{DS\text{-}MIN}$ at time t2. This minimum level $V_{DS\text{-}MIN}$ is substantially dependent on the current level of a current IDS flowing through the transistor device M in the on-state and an on-resistance of the transistor device M. The current level of the current IDS is dependent on the supply voltage Vi and the load Z. The on-resistance is dependent on a specific design of the transistor device M.

In FIG. 2, T1 denotes a time period between the time t1', when the output voltage $V_{DS}$ starts to decrease and the time t2, when the output voltage $V_{DS}$ reaches the minimum level $V_{DS\text{-}MIN}$. This time period will be referred to as first switching time T1 in the following. Equivalently, T2 denotes a time period between the time t3, when the input signal $S_{IN}$ changes from the on-level to the off-level, and a time t4, when the gate-source voltage $V_{GS}$ falls below the threshold voltage $V_{TH}$ so that the transistor device M switches off and the output voltage $V_{DS}$ reaches the maximum level Vi. Just for the purpose of explanation, the decrease and the increase of the output voltage $V_{DS}$ are drawn as linear decrease and linear increase, respectively. In a real circuit, the decrease and the increase are not linear. For example, by virtue of the so-called Miller effect there may be time periods when the output voltage $V_{DS}$ is substantially constant during the process of switching on or switching off the transistor device M. However, as those non-linearities are not important to understand the method explained herein below those non-linearities are not considered in the waveform diagrams shown in FIG. 2. Disregarding of how exactly the drain-source voltage $V_{DS}$ decreases between t1' and t2 and increases between t3 and t4, the time periods T1 and T2 are a measure for how fast the transistor device M switches on and switches off, respectively. That is, time periods T1 and T2 represent the switching speed of the transistor device M. This switching speed is defined by the drive circuit 1. In general, the switching speed at switching on the transistor device M is the higher the faster the drive circuit 1 charges the gate-source capacitance, and the switching speed at switching off the transistor device M is the higher the faster the drive circuit 1 discharges the gate-source capacitance $C_{GS}$.

According to one example, the drive circuit 1 is configured to adjust the switching speed of the transistor device M dependent on a frequency of the input signal $S_{IN}$. In particular, the drive circuit 1 is configured to increase the switching speed as the frequency of the input signal $S_{IN}$ increases, and vice versa.

Figure 3:
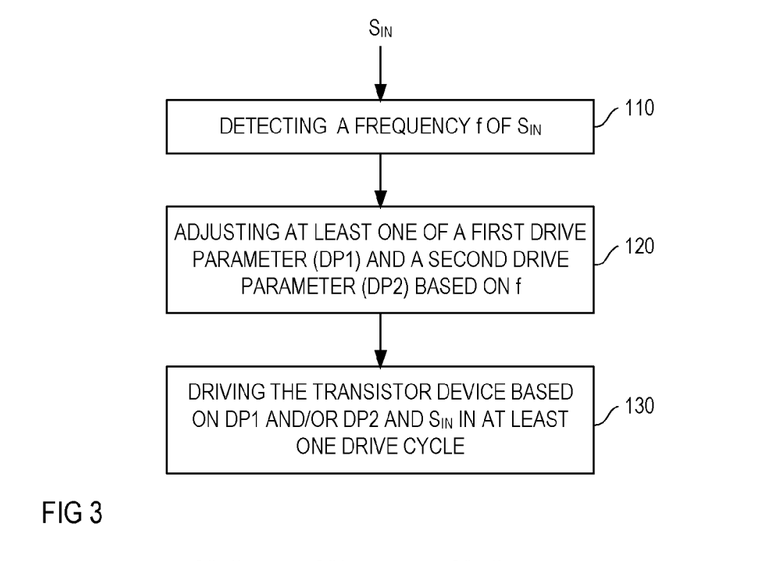
FIG. 3 shows one example of a method for driving the transistor device.

FIG. 3 shows a flow chart that illustrates one example of a method for driving the transistor device M by the drive circuit 1. Referring to FIG. 3, the method includes detecting a frequency f of the input signal $S_{IN}$ in a process step no. The method further includes adjusting at least one of a first drive parameter and a second drive parameter based on the detected frequency f (process step 120), and driving the transistor device M based on the at least one of the first drive parameter and the second drive parameter and dependent on the input signal $S_{IN}$, in at least one drive cycle (process step 130). Examples of this method are explained below with reference to FIG. 4.

Figure 4:
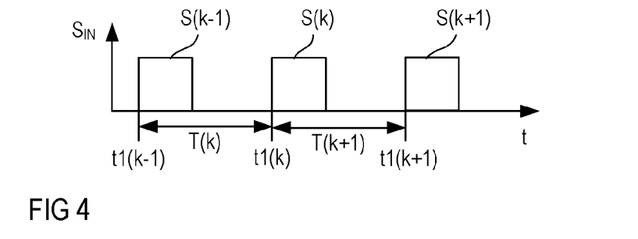
FIG. 4 illustrates one example of a waveform of an input signal received by the drive circuit.

FIG. 4 shows a waveform diagram of the input signal $S_{IN}$ according to one example. Referring to FIG. 4, the input signal $S_{IN}$ includes a sequence of drive pulses; three of these drive pulses are shown in FIG. 4. Each of these drive pulses S(k−1), S(k), S(k+1) has a first edge and a second edge. The first edge indicates that it is desired to switch on the transistor device M, and the second edge indicates that it is desired to switch off the transistor device M. In the example shown in FIG. 4, the first edge is a rising edge and the second edge is a falling edge, and t(k−1), t(k), t(k+1) denote those times at which the rising edge (first edge) of the respective drive pulse S(k−1), S(k), S(k+1) occurs. The input signal $S_{IN}$ defines a plurality of timely successive drive cycles, wherein each drive cycle includes a first time period when it is desired to switch on the transistor device M, and a second time period when it is desired to switch off the transistor device M. In the following, the first time period will be referred to as on-time and the second time period will be referred to as off-time. The on-time is governed by the drive pulse, and the off-time is governed by the time between two subsequent drive pulses. The duration of one drive cycle is given by a time period T(k), T(k+1) between the first edges (rising edges) of two subsequent drive pulses.

The durations of the individual drive pulses as well as the durations of the individual drive cycles may vary. Consequently, the frequency f of the input signal $S_{IN}$ may vary, wherein the frequency f is given by the reciprocal of the duration of one drive cycle.

Detecting the frequency of the input signal $S_{IN}$ may include measuring the duration of at least one drive cycle. For example, the drive circuit 1 is configured to measure the duration of a drive cycle k−1, which is the drive cycle including the drive pulse S(k−1) in FIG. 4, and to drive the transistor device M based on this detected frequency fin a subsequent drive cycle k. This drive cycle k is the drive cycle that includes the drive pulse S(k) shown in FIG. 4. Referring to FIG. 3, at least one of a first drive parameter DP1 and a second drive parameter DP2 is adjusted based on the detected frequency. According to one example, the first drive parameter DP1 is a drive parameter that adjusts the switching speed of the transistor device M at switching on, and DP2 adjusts the switching speed of the transistor device M at switching off. Examples of the first drive parameter DP1 and the second drive parameter DP2 are explained below. In the following, DP1(k) denotes the first drive parameter in drive cycle k and DP2(k) denotes the second drive parameter in the drive cycle k. According to one example, $$DP1(k)=g1(T(k)) \quad (1a),$$

$$DP2(k)=g2(T(k)) \quad (1b).$$

That is, DP1(k) is a function g1(•) of the duration T(k) of the previous drive cycle, and DP2(k) is a function g2(•) of the duration T(k) of the previous drive cycle. T(k) represents the frequency of the input signal $S_{IN}$.

According to another example, the drive circuit 1 is configured to detect the frequency f of the input signal $S_{IN}$ based on measuring the durations of several successive drive cycles. According to one example, the drive circuit 1 is configured to calculate an average duration of several subsequent drive cycles and adjust at least one of the first and second drive parameters DP1(k), DP2(k) based on the calculated average. That is, for example, $$DP1(k) = g1\left(\frac{1}{n}\sum_{i=1}^{n} T(k-i)\right), \quad (2a)$$

$$DP2(k) = g2\left(\frac{1}{n}\sum_{i=1}^{n} T(k-i)\right). \quad (2b)$$

According to one example, the drive circuit is configured to detect the frequency f of the input signal $S_{IN}$ anew before each drive cycle. According to another example, the drive circuit 1 is configured to use a detected frequency fin several subsequent drive cycles. For example, the drive circuit 1 is configured to detect the frequency f based on the durations of n subsequent drive cycles and uses the detected frequency to drive the transistor device M in a subsequent drive cycles before again updating the frequency information to be used for driving the transistor device M.

Figure 5:
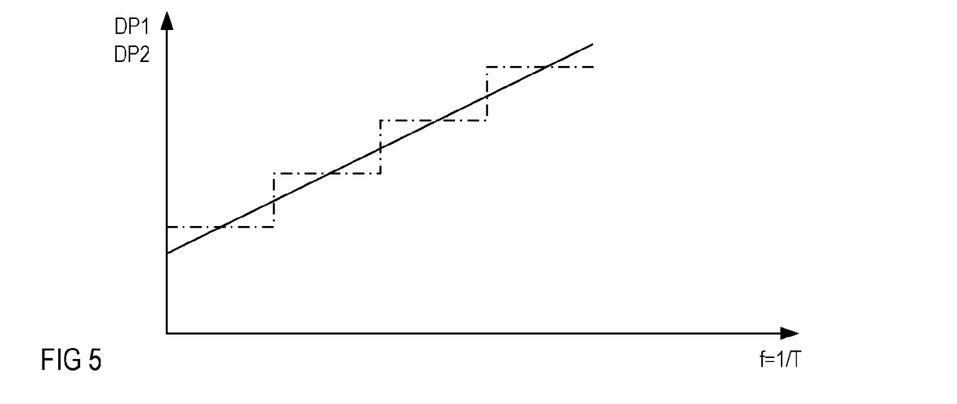
FIG. 5 schematically illustrates a relationship between a frequency of the drive signal and a current level of an output current of the driver shown in FIG. 4

For the purpose of explanation it is assumed that the switching speed of the transistor device M increases as the respective first drive parameter DP1 or second drive parameter DP2 increases. Two different examples of how these drive parameters DP1, DP2 can be dependent on the detected frequency f are shown in FIG. 5. According to one example (drawn in solid lines in FIG. 5), the drive parameters DP1, DP2 increase linearly as the frequency f increases. According to another example (drawn in dashed-and-dotted lines), there are two or more frequency ranges, wherein the drive parameters DP1, DP2 are substantially constant within the individual frequency ranges but increase towards higher frequencies.

Figure 6:
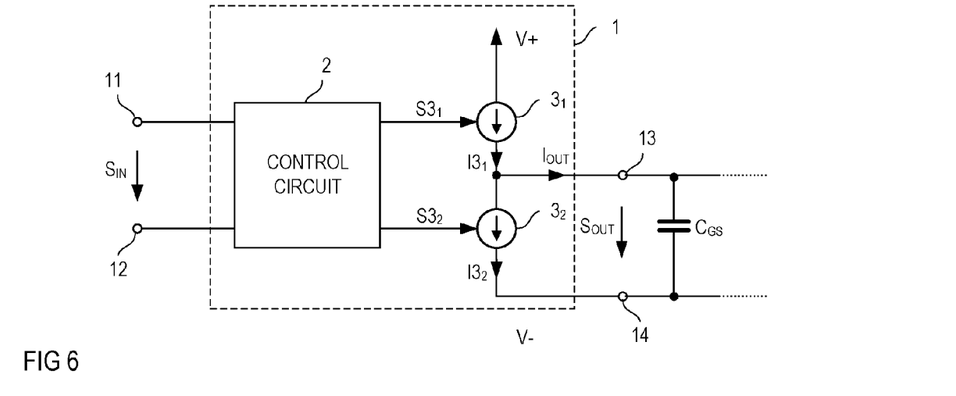
FIG. 6 illustrates one example of the drive circuit in greater detail.

FIG. 6 shows one example of the drive circuit 1. This drive circuit includes a first controllable current source $3_1$, connected between the first output node 13 and a supply node where a supply potential V+ is available, and a second controllable current source $3_2$ connected between the first output node 13 and the second output node 14. A control circuit 2 receives the input signal $S_{IN}$ and is configured to control the current sources $3_1$, $3_2$. In this example, the control circuit 2 generates a first control signal $S3_1$ that controls the first current source $3_1$, and a second control signal $S3_2$ that controls the second current source $3_2$. In this drive circuit 1, the first current source $3_1$ serves to charge the gate-source capacitance $C_{GS}$ in order to switch on the transistor device M, and the second current source $3_2$ serves to discharge the gate-source capacitance $C_{GS}$ in order to switch off the transistor device M.

The first current source $3_1$ is configured to supply a first current $I3_1$, and the second current source $3_2$ is configured to supply a second current $I3_2$. The current level of the first current $I3_1$ affects the switching speed of the transistor device M (from which only the gate-source capacitance $C_{GS}$ is shown in FIG. 6) in the process of switching on, whereas the switching speed increases as the current level of the first current $I3_1$ increases. Equivalently, a current level of the second current $I3_2$ affects a switching speed of the transistor device M in the process of switching off, whereas the switching speed increases as the current level of this second current $I3_2$ increases. Thus, the current level of the first current $I3_1$ is the first drive parameter DP1 in this example, and the current level of the second current $I3_2$ is the second drive parameter DP2 in this example. The control circuit 2 is configured to adjust at least one of the current level of the first current $I3_1$ and the current level of the second current $I3_2$ based on the detected frequency of the input signal $S_{IN}$, wherein the control circuit 2 is configured to detect this frequency of the input signal $S_{IN}$.

Figure 7:
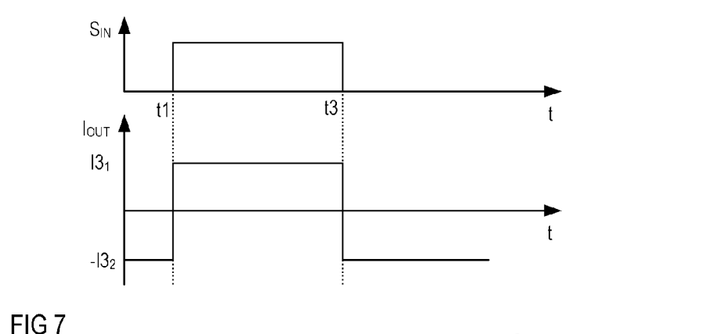
FIG. 7 shows waveforms that illustrate one way of operation of the drive circuit shown in FIG. 6.

One way of operation of the drive circuit 1 shown in FIG. 6 is explained with reference to FIG. 7 below. FIG. 7 shows waveform diagrams of the input signal $S_{IN}$ in one drive cycle and the output current $I_{OUT}$ of the drive circuit 1. The output current $I_{OUT}$ is the current into the first output node 13. Referring to FIG. 7, the control circuit 2 is configured to deactivate the second current source $3_2$ and to activate the first current source $3_1$ when a first edge (a rising edge) of a drive pulse of the input signal $S_{IN}$ occurs. Through this, the output current $I_{OUT}$ equals the first current $I3_1$, whereas a current level of this first current $I3_1$ may be dependent on the detected frequency of the input signal $S_{IN}$. When the control circuit 2 detects the second edge (falling edge) of the drive pulse, it deactivates the first current source $3_1$ and activates the second current source $3_2$, so that the output current $I_{OUT}$ equals $-I3_1$. In the diagram shown in FIG. 7, the output current $I_{OUT}$ is drawn to have one of the first current level and the second current level at each time. However, this is only an example. The current level of the output current $I_{OUT}$ may decrease (not shown in FIG. 7) or turn zero as the gate-source capacitance $C_{GS}$ is completely charged or discharged, respectively.

Figure 8:
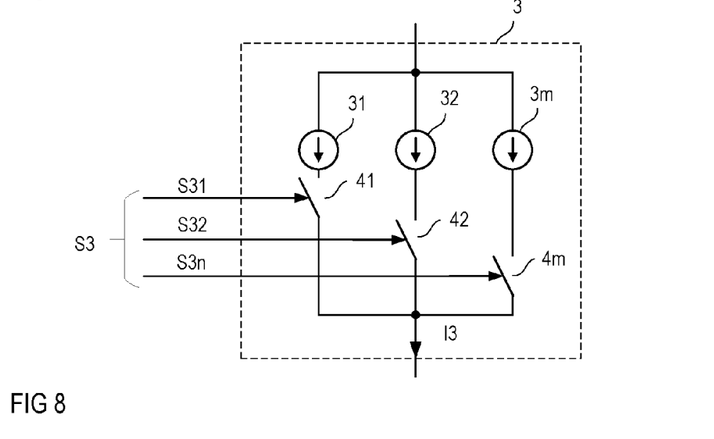
FIG. 8 shows one example of an output stage of the drive circuit shown in FIG. 4.

FIG. 8 shows one example of how the first and second current sources $3_1$, $3_2$ can be implemented. The current source 3 shown in FIG. 8 represents one of the first and second current sources $3_1$, $3_2$, and the control signal S3 represents the corresponding control signal $S3_1$, $S3_2$. I3 denotes the current provided by this current source 3. The current source 3 includes a plurality of constant current sources 31, 32, 3m, with each of these current sources 31, 32, 3m connected in series with an electronic switch 41, 42, 4m. These series circuits are connected in parallel. The control signal S3 includes a plurality of sub-signals S31, S32, S3m, wherein each of these signals controls one of the switches 41, 42, 4m. This current source 3 is activated when at least one of the switches 41, 42, 4m is switched on. The current level of the current I3 is adjusted by selecting which of the switches 41, 42, 4m is/are switched on. According to one example, the currents provided by the individual current sources 31, 32, 3m are equal. In this case, m different current levels can be adjusted, wherein m denotes the number of current sources connected in parallel. According to another example, the current levels of the currents provided by the individual current sources 31, 32, 3m are different. In this case, $2^m-1$ different current levels can be adjusted.

Figure 9:
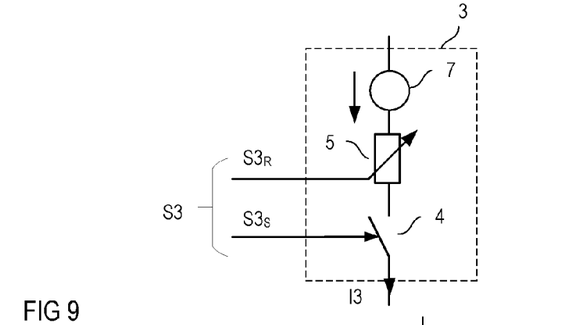
FIG. 9 shows another example of an output stage of the drive circuit shown in FIG. 4.

FIG. 9 shows a current source 3 according to another example. In this example, the current source includes a variable resistor 5 connected in series with a voltage source 7 and an electronic switch 4. An output current I3 of this current source 3 is dependent on a resistance of the variable resistor 5, whereas the output current I3 increases as the resistance of the variable resistor 5 decreases. The control signal S3 includes a first sub-signal $S3_R$ which adjusts the resistance of the variable resistor 5, and a second sub-signal $S3_S$ that switches on or off the electronic switch 4, wherein the current source 3 is activated when the electronic switch 4 is switched on and deactivated when the electronic switch 4 is switched off.

Figure 10:
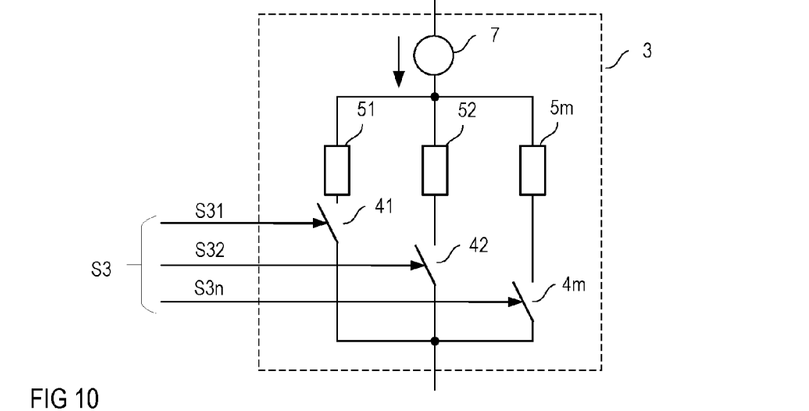
FIG. 10 shows another example of an output stage of the drive circuit shown in FIG. 4.

FIG. 10 shows a modification of the current source 3 shown in FIG. 9. In this example, the current source 3 includes a plurality of resistors 51, 52, 5m with each of these resistors being connected in series with one electronic switch 41, 42, 4m. The control signal S3 includes m sub-signals with each of these sub-signals S31, S32, S3m being configured to control one of the electronic switches 41, 42, 4m. The current source 3 includes m series circuits with each of these series circuits including one resistor 51, 52, 5m and one electronic switch 41, 42, 4m. The individual series circuits are connected in parallel, wherein the parallel circuit is connected in series with the voltage source 7. The parallel circuit has an overall resistance, wherein this overall resistance is defined by which of the resistors 51, 52, 5m is/are activated by having the corresponding switch 41, 42, 4m switched on.

Figure 11:
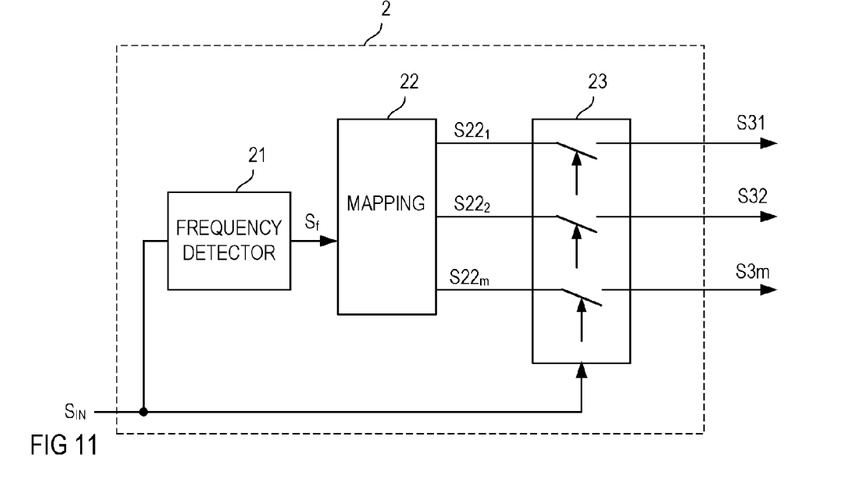
FIG. 11 shows one example of a control circuit in the drive circuit shown in FIG. 4.

FIG. 11 shows one example of a control circuit 2 that is configured to control a current source of one of the types shown in FIG. 8 or 10. This control circuit 2 includes a frequency detector 21 which receives the input signal $S_{IN}$ and is configured to detect the frequency of the input signal $S_{IN}$. A frequency information $S_f$ provided by the frequency detector 21 is forwarded to a mapping circuit 22. The frequency information $S_f$ is an information on the detected frequency of the input signal $S_{IN}$. This frequency information may include one of the detected frequency f, the duration of one drive cycle, or an average duration of several drive cycles. The mapping circuit 22, based on the frequency information $S_f$ determines the desired output current of the current source 3. It should be noted, that in FIG. 11 controlling only one current source 3 is shown. Of course, the other current source can be controlled in the same way.

In the example shown in Figure ii, the mapping circuit 22, based on the frequency signal $S_f$ decides which of the plurality of current sources (31, 32, 3m in FIG. 8) or resistors (51, 52, 5m shown in FIG. 10) is to be actuated and generates a plurality of output signals $S22_1$, $S22_2$, $S22_m$ wherein each of these output signals $S22_1$-$S22$ is configured to activate one of the current sources or resistors. A switching circuit 23 receives these output signals $S22_1$, $S22_2$, $S22_m$ and the input signal $S_{IN}$ and generates the sub-signals S31, S32, 53m based on the output signals. In this control circuit 2, the output signals $S22_1$-$S22_m$ define which of the current sources or resistors are to be activated, and the input signal $S_{IN}$ defines the timing. That is, the input signal $S_{IN}$ defines when the individual current sources or resistors are to be activated.

Figure 12:
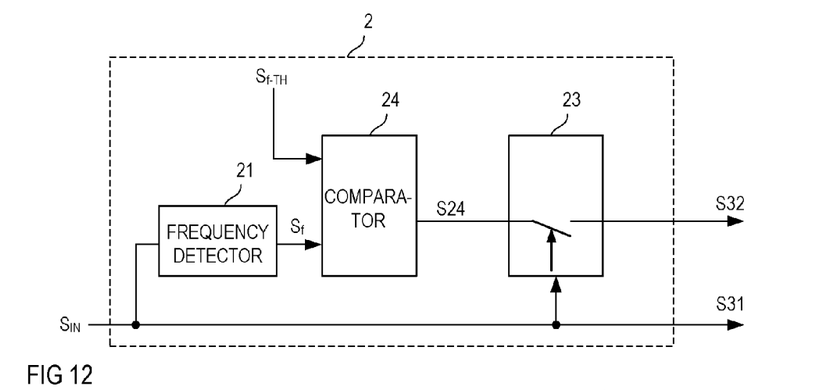
FIG. 12 shows another example of a control circuit in the drive circuit shown in FIG. 4.

FIG. 12 shows a simplified control circuit 2. This control circuit 2 is configured to control two current sources or resistors. A first output signal S31 of this control circuit 2 corresponds to the input signal $S_{IN}$. A second output signal S32 is dependent on the frequency information $S_f$. A comparator 24 compares the frequency information $S_f$ with a reference $S_{f-TH}$ and activates a second one of the current sources or resistors dependent on whether the frequency information $S_f$ is below or above the reference $S_{f-TH}$. An output signal S24 of this comparator 24 is dependent on the comparison, and a switching circuit 23 generates the sub-signal S32 based on the output signal of the comparator 24.

Figure 13:
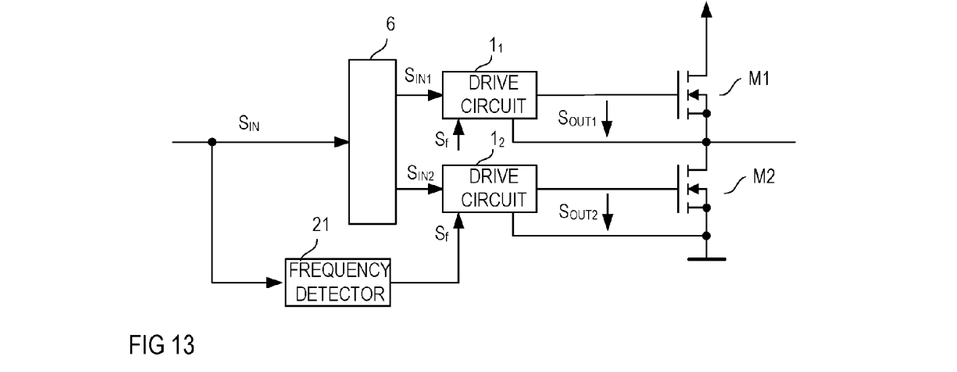
FIG. 13 shows an electronic circuit including a half-bridge and a drive circuit.

FIG. 13 shows an electronic circuit according to another example. This electronic circuit includes a half-bridge with a first transistor M1 and a second transistor M2. A first drive circuit $1_1$ drives the first transistor device M1, and a second drive circuit $1_2$ controls the second transistor device M2. The first drive circuit $1_1$ drives the first transistor device M1 dependent on a first input signal $S_{IN1}$ and the frequency information $S_f$. The frequency information $S_f$ is provided by the frequency detector 21 based on an input signal $S_{IN}$. The second drive circuit $1_2$ receives a second input signal $S_{IN2}$ and the frequency information $S_f$ drives the second transistor device M2 based on these signals.

Figure 14:
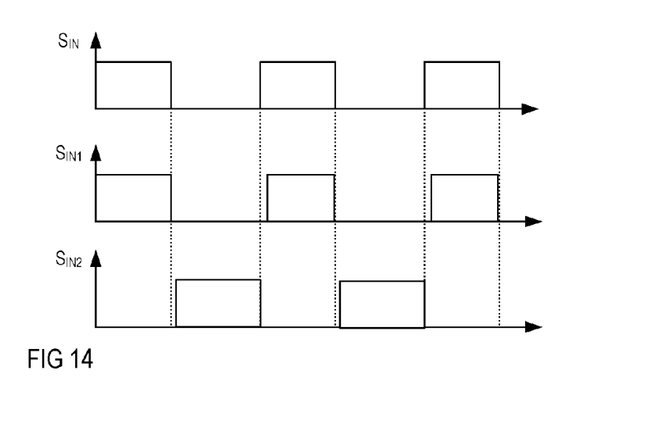
FIG. 14 shows waveforms that illustrate one way of operation of an input stage of the drive circuit shown in FIG. 11.

A control circuit 6 generates the first input signal $S_{IN1}$ and the second input signal $S_{IN2}$ based on the input signal $S_{IN}$ as shown in FIG. 14. In particular, the control circuit 6 generates the first input signal $S_{IN1}$, $S_{IN2}$ such that only one of the first transistor device M1 and the second transistor device M2 is switched on at one time. According to one example, the control circuit 6 generates the first input signal $S_{IN1}$ and the second input signal $S_{IN2}$ such that the first transistor device M1 is switched on when the input signal $S_{IN}$ has a first signal level and that the second transistor device M2 is switched on when the input signal $S_{IN}$ has a second signal level different from the first signal level.

In the electronic circuit shown in FIG. 13, the first drive circuit $1_1$ and the second drive circuit $1_2$ share the frequency detector 21 which is drawn outside the first drive circuit $1_1$ and the second drive circuit $1_2$ in FIG. 13. Except for this, the first drive circuit $1_1$ and the second drive circuit $1_2$ may correspond to each of the drive circuits 1 explained herein before.

What is claimed is:

1. A method, comprising:
   measuring a frequency of an input signal received by a drive circuit; and
   driving a transistor device by the drive circuit based on the input signal, wherein a switching speed of the transistor device is dependent on the measured frequency.

2. The method of claim 1, further comprising increasing the switching speed of the transistor device as the measured frequency increases.

3. The method of claim 1, wherein the switching speed of the transistor device comprises the switching speed of at least at one of switching on the transistor device and switching off the transistor device.

4. The method of claim 1, wherein driving the transistor device comprises generating a drive signal at a gate node of the transistor device.

5. The method of claim 4, further comprising increasing the switching speed of the transistor device as the measured frequency increases, wherein
   generating the drive signal comprises driving a gate current into the gate node, and
   increasing the switching speed comprises increasing a current level of the gate current.

6. The method of claim 5, wherein:
   switching on the transistor device comprises driving the gate current in a first direction; and
   switching off the transistor device comprises driving the gate current in a second direction opposite the first direction.

7. The method of claim 1, wherein:
   driving the transistor device comprises driving the transistor device in a plurality of timely successive drive cycles such that the transistor device switches on once and switches off once in each drive cycle; and
   measuring the frequency comprises measuring a duration of at least one drive cycle.

8. The method of claim 7, wherein measuring the frequency comprises measuring durations of several successive drive cycles and calculating and average duration based on the measured durations.

9. The method of claim 7, wherein measuring the frequency comprises measuring the frequency anew before each drive cycle.

10. The method of claim 7, wherein measuring the frequency comprises measuring the frequency every n drive cycles and applying the measured frequency in n successive drive cycles.

11. A drive circuit configured to:
    receive an input signal;
    measure a frequency of the input signal; and
    drive a transistor device based on the input signal, wherein a switching speed of the transistor device is dependent on the measured frequency.

12. The drive circuit of claim 11, wherein the drive circuit is configured to increase the switching speed as the measured frequency increases.

13. The drive circuit of claim 11, wherein the drive circuit is configured to drive the transistor device based on the measured frequency at least at one of switching on and switching off the transistor device.

14. The drive circuit of claim 11, wherein the drive circuit is configured to drive the transistor device by generating a drive signal at a gate node of the transistor device.

15. The drive circuit of claim 14, wherein the drive circuit is configured to:
    generate the drive signal by driving a gate current into the gate node; and
    increase the switching by increasing a current level of the gate current.

16. The drive circuit of claim 15, wherein the drive circuit is configured to:
    switch on the transistor device by driving the gate current in a first direction; and
    switch off the transistor device by driving the gate current in a second direction opposite the first direction.

17. The drive circuit of claim 15, wherein the drive circuit is configured to:
    drive the transistor device in a plurality of timely successive drive cycles such that the transistor device switches on once and switches off once in each drive cycle; and
    measure the frequency by measuring a duration of at least one drive cycle.

18. The drive circuit of claim 17, wherein the drive circuit is configured to measure the frequency by measuring durations of several successive drive cycles and calculating an average duration based on the measured durations.

19. The drive circuit of claim 17, wherein the drive circuit is configured to measure the frequency by measuring the frequency anew before each drive cycle.

20. The drive circuit of claim 17, wherein the drive circuit is configured to measure the frequency every n drive cycles and apply the measured frequency in n successive drive cycles.

\* \* \* \* \*